United States Patent [19]

Fujimoto

[11] 4,258,327
[45] Mar. 24, 1981

[54] DETECTOR CIRCUIT WITH INTEGRATING FEEDBACK MEANS

[75] Inventor: Kay K. Fujimoto, Granada Hills, Calif.

[73] Assignee: RCA Corporation, New York, N.Y.

[21] Appl. No.: 54,927

[22] Filed: Jul. 5, 1979

[51] Int. Cl.³ .............................................. H03D 1/18
[52] U.S. Cl. .................................... 329/101; 329/192
[58] Field of Search .......... 329/169, 192, 202, 205 R, 329/103; 307/351; 328/162, 165

[56] References Cited

U.S. PATENT DOCUMENTS

| | | | |
|---|---|---|---|
| 2,807,718 | 9/1957 | Chressanthis et al. | 329/101 |
| 2,873,359 | 2/1959 | Cooper et al. | 329/103 |
| 3,031,624 | 4/1962 | Moore et al. | 329/101 |
| 3,737,790 | 6/1973 | Brown | 328/165 |
| 3,852,676 | 12/1974 | Hongu | 329/103 |
| 4,125,812 | 11/1978 | Polonio | 328/165 |

OTHER PUBLICATIONS

Matheson, R. J. "High Impedance Driver Boots Detector's Dynamic Range", Electronics, 10/25/71, p. 79.
Turner, R. J. "AGC RF Threshold Detector Provides Fast Slewing", Electronics 12/18/72, p. 107–108.
Merlen et al., "Interrogator Circuit Can Tell Good Data from Bad", Electronics, 7/13/64, p. 58.

*Primary Examiner*—David K. Moore
*Attorney, Agent, or Firm*—R. L. Troike; Allen LeRoy Limberg; Eric Herrmann

[57] ABSTRACT

An envelope detecting circuit capacitively connected to a signal source and arranged to counteract the effect of d-c potential shifts at the interconnection of capacitor and detector. A portion of the detected signal is integrated to provide a signal proportional to input signal amplitude or duration and applied to said interconnection to dynamically forestall the effect of d-c offset potentials.

10 Claims, 4 Drawing Figures

DETECTOR CIRCUIT WITH INTEGRATING FEEDBACK MEANS

This invention relates to envelope or peak detector circuits, and in particular to detector circuits connected via a d-c blocking capacitor to the input signal source and direct coupled to driver circuitry.

Diode detectors, connected coupled to an input signal source via a d-c blocking capacitor tend to produce an amplitude response which is nonlinear with input signal duration. This results as a consequence of the charge on the d-c blocking capacitor decaying while the detecting diode is forward biased. Signal which then swings in a direction to reverse bias the detecting diode causes the potential at the interconnection of coupling capacitor and diode to exceed the desired potential by an amount commensurate with the charge decay. A subsequent potential swing in a direction to forward bias the detecting diode is offset by an amount proportional to the potential decay. This has the effect of offsetting the threshold voltage of the diode and undesirably reducing the peak output potential of the circuit. The longer the duration of a signal pulse, the greater the decay and the larger the undesired offset.

Envelope detector circuitry embodying the present invention senses the output potential of the detector, integrates this potential over time and applies a portion of the integrated potential to the input of the detector to compensate for the offset created by the charge decay.

Figure 1:
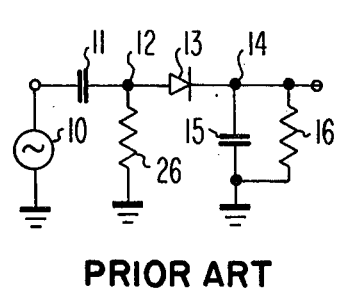
FIG. 1 is a circuit schematic of a prior art envelope or peak detector circuit.

In the FIG. 1, signal source 10 applies a time varying signal to the envelope or peak detector comprising diode 13, capacitor 15 and resistor 16. Capacitor 11 is interposed between source 10 and the detector circuit to facilitate d.c. biasing. The FIG. 1 circuit operates to detect the envelope of the input signal in the following manner. Initially resistors 26 and 16 establish d.c. potentials of zero volts, as referred to ground, at nodes 12 and 14. A positive-going signal potential applied by source 10 is applied substantially in its entirety by capacitor 11 to forward-bias diode 13 and charge capacitor 15. A subsequent negative-going signal from source 10 reverse-biases the diode, leaving the previous positive potential peak stored on capacitor 15. This potential decays at a predetermined rate established by the resistance R16 of resistor 16 and capacitance C15 of capacitor 15. A further positive peak recharges capacitor 15, etc. Supposing that the positive signal peaks occur at a rate faster than the R16-C15 decay constant, the resultant potential at node 14 will follow the envelope of the positive peaks of the input signal.

Figure 2:
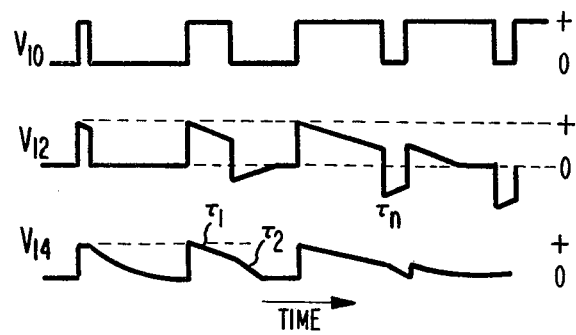
FIG. 2 is a time-voltage graph of waveforms occurring in the FIG. 1 circuit.

The FIG. 1 circuit, however, exhibits a nonlinearity with respect to signal peaks of varying duration and/or relatively large potential. The nonlinearity is demonstrated in the waveforms of FIG. 2. Ideally an envelope or peak detector will provide a uniform amplitude output signal for an input signal having a constant peak swing. The waveform V10 having constant amplitude pulses of varying duration is assumed to be applied by source 10. The waveform designated V12 is the resultant potential at node 12. Each pulse applied by source 10 is coupled to node 12 with an amplitude proportional to $C_{11}/(C_{11}+C_{15})$ where $C_{11}$ and $C_{15}$ are the respective capacitances of capacitors 11 and 15, $C_{11}$ being presumed much larger than $C_{15}$. Immediately after the leading edge of a pulse, the potential V12 begins to decay in conformance with $\exp(-t/R_P C_{11})$, where $R_P$ is the resistance of the parallel combination of resistors 26 and 16. This decay continues until the input pulse swings negative, e.g., at time $T\eta$ or node 12 is discharged to ground potential. The potential V12 swings in a negative direction an amount at least as large as the amplitude of the leading edge of the coupled pulse. The resultant potential is below ground reference potential and immediately begins to decay in a positive direction toward ground reference potential in conformance with $\exp(-t/C_{11} R_{26})$. If the input pulse duration exceeds a particular value, potential V12 is unable to restore to reference potential before the next input pulse occurs, tending to place a negative bias on that next coupled pulse such that its amplitude is effectively diminished.

The potential V12 is translated to node 14, less a diode forward offset potential, while the diode 13 is forward-biased. The negative swing of the pulse at node 12 reverse-biases diode 13, isolating node 14 from node 12. The charge on capacitor 15 then decays in conformance with $\exp(-t/R_{16} C_{15})$. The potential V14 thus exhibits a waveform having pulses with two decay rates, i.e., $\tau 1 R_P C_{11}$ and $\tau 2 = R_{16} C_{15}$. It is noted that the peak output amplitude for the fourth pulse is diminished, while the input peak amplitude remains constant. It can be shown that a similar non-linearity occurs for pulses of varying amplitude and constant duration. The non-linearity is not confined to pulse waveforms, but extends to linear input signals and amplitude modulated carriers as well.

Figure 3:
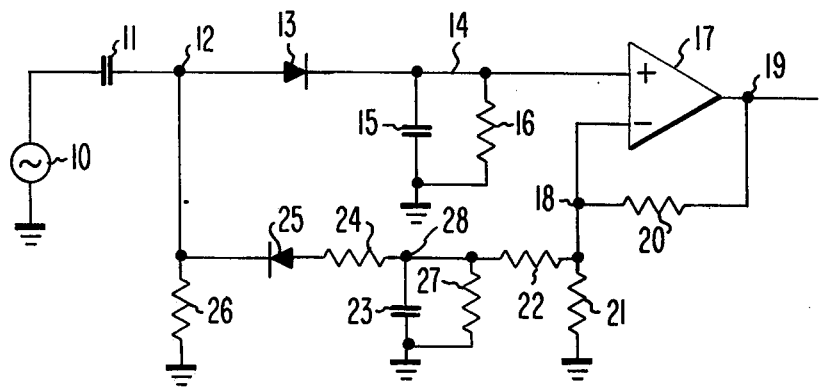
FIGS. 3 and 4 are circuit schematics of envelope detector circuits embodying the present invention.

The circuit of FIG. 3 includes the basic detector circuit of FIG. 1 plus circuit means to correct the above described non-linearity. Differential-input amplifier 17 senses the potential at node 14 at its non-inverting input cannection. Amplifier 17 by virtue of its having high gain and being provided with feedback resistor 20 conditions the potential between its inverting and non-inverting input connections to approach zero. This establishes the potential at node 18 to be equal to the potential at node 14 without loading node 14. The potential at node 18 charges capacitor 23 through resistor 22. If the time constant $R_T C23$ of capacitor 23 and the Thevenin equivalent $R_T$ of resistors 22 and 27 is large in comparison with the time required for the potential at node 18 to make an appreciable change, the change in voltage across capacitor 23 will be small in comparison to the drop across resistor 22. The potential $V_C$ across capacitor 23 can then be represented by $$V_C = (1)/(R_T C23) \int V_T(t) dt \qquad (1)$$

where $V_T(t)$ is the Thevenin voltage applied to the Thevenin resistance $R_T$, which voltage is proportional to the potential at node 18 and is thus proportional to the potential at node 14.

The integration has the effect of smoothing or averaging the potential at node 28. The average value of the potential fluctuates in proportion to the integral over time of the waveform at node 14. The potential at node 28 sets the threshold at which diode 25, with cathode connected to node 12, will conduct. The larger the integral of the potential at node 14 the more positive the anode voltage of diode 25, and the sooner it will conduct for a negative going potential swing at node 12. Therefore, the negative excursion of the potential at node 12 is dynamically controlled in direct relation to the input pulse width and amplitude.

Figure 4:
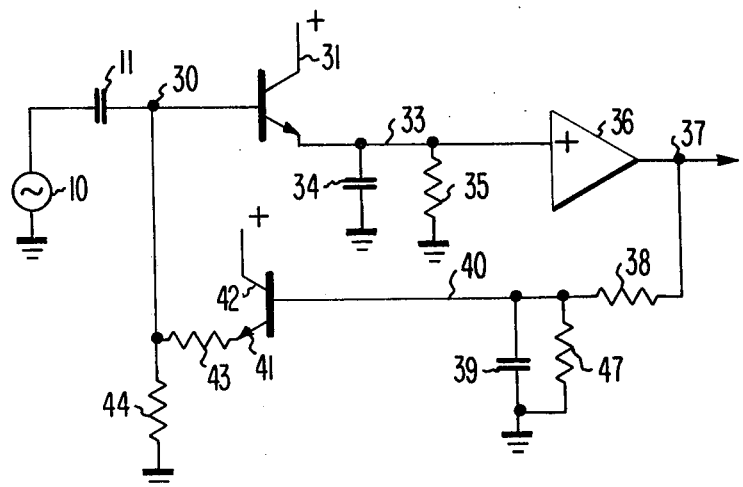

The resistor 24 is serially connected with diode 25 to prevent an abrupt discharge of capacitor 23 and thereby reducing the generation of undesirable transients in the integrating circuit. The resistor 21 in conjunction with feedback resistor 20 establishes the gain exhibited at output node 19 of amplifier 17 at $1+(R20/R21.)$ The circuit of FIG. 4 operates on similar concepts to the FIG. 3 circuit. Signal source 10 is connected via capacitor 11 to the peak detector including the base-emitter junction 32 of transistor 31, capacitor 34 and resistor 35. The output potential of the detector at node 33 is sensed by buffer amplifier 36. Detected output signal at the output connection 37 of amplifier 36 is applied to the integrating circuit including resistors 38 and 47 and capacitor 39 providing an averaged potential at connection 40. The potential at connection 40 effects a dynamic adjustment of the threshold potential at which the base-emitter circuit of transistor 42 will conduct when node 30 swings negative to forward-bias emitter electrode 41.

The use of the base-emitter junction of transistor 31 for the detecting diode increases the effective impedance of resistor 35 by the common-emitter forward current gain of transistor 31 to reduce the initial potential decay at the detector input node 30. Similarly transistor 42 performs to buffer the potential on capacitor 39 when node 30 swings negative, permitting the use of a smaller capacitance.

Armed with the foregoing, one skilled in the art of detector circuits will readily be able to construct variations without straying from the spirit of the invention and the claims should be construed accordingly.

What is claimed is:

1. In an electrical circuit having a signal source, an envelope detecting circuit comprising:
    envelope detecting means having an input connection at a first node and having an output connection at a second node, said detecting means unidirectionally conducting current between the first and second node responsive to potential at the first node;
    means for applying signal from the signal source to the first node, including a first capacitor for blocking d-c;
    means for integrating at least a portion of the potential at the second node to provide integrated potential; and
    means for applying a portion of the integrated potential to the first node to counteract a tendency for d-c shifts thereat.

2. An electrical circuit as set forth in claim 1 wherein the means for integrating the potential at the second node and for applying a portion of the integrated potential to the first node includes:
    a differential-input amplifier having a non-inverting input connected to the second node, having an inverting input and having an output connection;
    direct coupled feedback means from the output connection of the differential-input amplifier to its inverting input connection;
    a second capacitor having a first plate connected to a point of fixed potential and having a second plate;
    means connecting the second plate of the second capacitor to the inverting input of the differential-input amplifier; and
    a pn junction having a first end connected to the first node and a second end connected to the second plate of the capacitor, said pn junction poled to conduct in an alternate direction to the peak detecting means relative to the first node.

3. An electrical circuit as set forth in claim 1 wherein the means for integrating the potential at the second node and for applying a portion of the integrated potential to the first node includes:
    a buffer amplifier having an input connection for receiving signal from the second node and having an output connection for supplying potential directly related to that appearing at its input connection;
    a second capacitor having a first plate connected to a point of fixed potential and having a second plate;
    means connecting the output connection of the buffer amplifier to the second plate of the second capacitor; and
    a pn junction having a first end connected to the first node and a second end connected to the second plate of the second capacitor, said pn junction poled to conduct in an alternate direction to the peak detecting means relative to the first node.

4. An electrical circuit as set forth in claims 2 or 3 wherein the pn junction comprises a diode.

5. An electrical circuit as set forth in claims 2 or 3 wherein the pn junction comprises the base-emitter junction of a bipolar transistor.

6. An envelope detecting circuit comprising:
    a first capacitor having a first plate connected to a source of time varying signal and having a second plate, connected to a first node;
    a detecting pn junction having a first end connected at the first node and having a second end connected to a second node for supplying output singal responsive to the envelope defined by signal peaks of a particular polarity at said first node;
    a second capacitor connected between the second node and a point of fixed potential;
    means for integrating at least a portion of the potential at the second node and providing an integrated potential; and
    means for applying a portion of said integrated potential to the first node.

7. An envelope detecting circuit as set forth in claim 6 wherein the means for integrating the potential at the second node and for applying a portion of the integrated potential to the first node includes:
    a buffer amplifier having an input connection for receiving signal from the second node and having an output connection;
    a further capacitor having a first plate connected to a point of fixed potential and having a second plate;
    means connecting the output connection of the buffer amplifier to the second plate of the further capacitor;
    a further pn junction having a first end connected to the first node and having a second end connected to the second plate of the further capacitor, said further pn junction poled to conduct in an alternate direction to the detecting pn junction relative to the first node.

8. An envelope detecting circuit as set forth in claim 6 wherein the means for integrating the potential at the second node and for applying a portion of the integrated potential to the first node includes;

a differential-input amplifier having a non-inverting input connected to the second node, and having an inverting input connected via direct coupled feedback means to an output connection;

a further capacitor having a first plate connected to a point of fixed potential and having a second plate;

means connecting the inverting input of the differential-input amplifier to the second plate of the further capacitor; and a further pn junction having a first end connected to the first node and having a second end connected to the second plate of the further capacitor, said pn junction poled to conduct in an alternate direction to the detecting pn junction relative to the first node.

9. A peak detecting circuit as set forth in claims 7 and 8 wherein the further pn junction comprises a diode.

10. A peak detecting circuit as set forth in claims 7 and 8 wherein the further pn junction comprises the base-emitter junction of a bipolar transistor.

* * * * *